(12) United States Patent
Makita et al.

(10) Patent No.: US 6,192,902 B1
(45) Date of Patent: Feb. 27, 2001

(54) CHEMICAL TREATING APPARATUS AND FLOW RATE CONTROLLING METHOD THEREOF

(75) Inventors: Masahiro Makita; Mitsuhiro Nishizaki, both of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/133,373

(22) Filed: Aug. 13, 1998

(30) Foreign Application Priority Data

Aug. 20, 1997 (JP) .................................................. 9-223226

(51) Int. Cl.[7] .......................................................... B08B 3/04
(52) U.S. Cl. ............................ 134/113; 134/186; 134/902
(58) Field of Search ........................... 134/32, 186, 56 R, 134/57 R, 902, 113; 137/391, 395, 386; 68/181 R; 415/26

(56) References Cited

U.S. PATENT DOCUMENTS

| | | | |
|---|---|---|---|
| 3,837,353 | * | 9/1974 | Hopkin et al. . |
| 3,964,956 | * | 6/1976 | Snyder ................................ 134/902 |
| 4,042,444 | * | 8/1977 | Snyder . |
| 4,740,137 | * | 4/1988 | Karassik . |
| 4,852,053 | * | 7/1989 | Turrie . |
| 4,956,763 | * | 9/1990 | Stewart, Jr. et al. . |
| 5,485,861 | * | 1/1996 | Hiratsuka et al. ................... 134/186 |
| 5,722,441 | * | 3/1998 | Teramoto ............................. 134/902 |
| 5,922,138 | * | 7/1999 | Shindo et al. ....................... 134/186 |
| 5,948,173 | * | 9/1999 | Huh et al. ........................... 134/186 |

FOREIGN PATENT DOCUMENTS 4-247621 * 9/1992 (JP) ..................................... 134/186

* cited by examiner

*Primary Examiner*—Frankie L. Stinson
(74) *Attorney, Agent, or Firm*—Ronald P. Kananen; Rader, Fishman & Grauer (57) ABSTRACT

When trying to keep the amount of a liquid treating chemical in a treating bath constant by discharging almost the same amount of the liquid treating chemical as the liquid treating chemical supplied, the flow of the liquid treating chemical in the treating bath fell into disorder, which made it hard to keep the flow of the liquid treating chemical in the treating bath in the laminar state.

A down-flow type chemical treating apparatus 1 in which a liquid treating chemical 21 is supplied from the outside of a treating bath 2 (main bath 3) while the liquid treating chemical 21 is discharged from the bottom portion of the treating bath 2 (main bath 3), comprising a pump 5 on the chemical discharging side of the main bath 3 which consists of a rotary pump allowing to discharge the liquid treating chemical 21 to the outside of the main bath 3 keeping the flow of the liquid treating chemical 21 substantially in the main bath 3 almost in the laminar state.

9 Claims, 5 Drawing Sheets

CHEMICAL TREATING APPARATUS AND FLOW RATE CONTROLLING METHOD THEREOF

BACKGROUND OF THE INVENTION

1. Field of the Invention

This invention relates to a chemical treating apparatus and a flow rate controlling method thereof, particularly to a chemical treating apparatus used in the manufacturing process of semiconductor devices, especially in the cleaning process, and a flow rate controlling method thereof.

2. Description of the Prior Art

As it will be stated below, there are two methods for treating (cleaning, etching, etc.) the face surface or the back surface of a substrate such as a semiconductor substrate, a quartz substrate, and the like.

Figure 1:
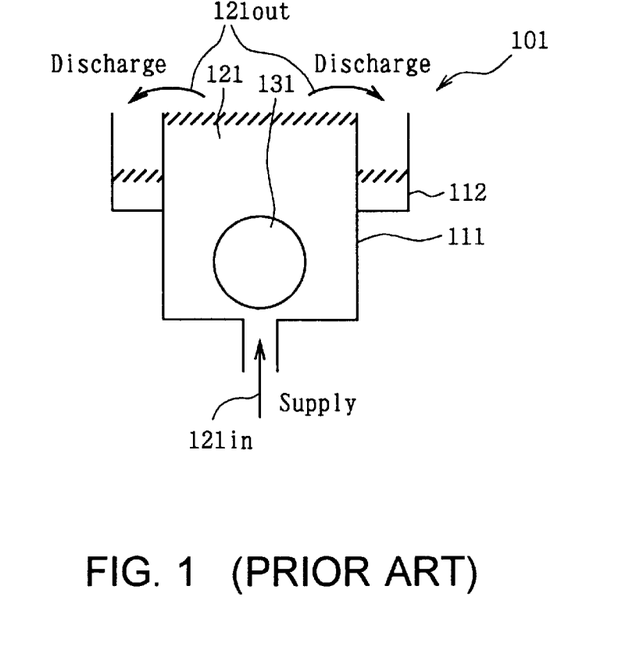
FIG. 1 is a schematic block diagram illustrating a conventional overflow type chemical treating apparatus.

(a) One method of chemical treatment is using an overflow type chemical treating apparatus 101, as shown in FIG. 1, in which the subject of treatment (for example, semicondutor wafer, glass wafer, etc.) 131 is placed in a main bath 111, and a liquid treating chemical 121in (shown by an arrow) is supplied to the main bath 111 from its bottom portion while the liquid treating chemical 121out (shown by an arrow) in the main bath 111 is discharged from the top portion of the main bath 111 into an outer bath 112 provided on the top periphery of the main bath 111.

Figure 2:
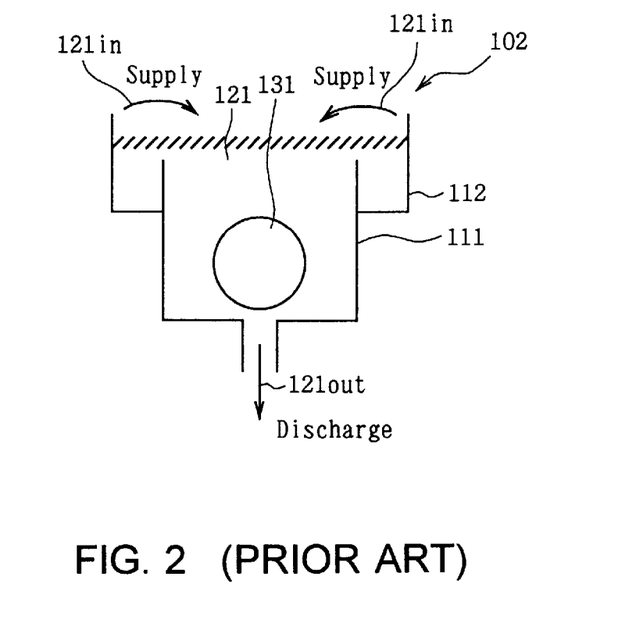
FIG. 2 is a schematic block diagram illustrating a conventional down-flow type chemical treating apparatus.

(b) The other method is using a down-flow type chemical treating apparatus 102, as shown in FIG. 2, in which the subject of treatment (for example, a semicondutor wafer, a glass wafer, etc.) 131 is placed in a main bath 111, and a liquid treating chemical 121in (shown by an arrow) is supplied to the main bath 111 from an outer bath 112 formed on the top periphery of the main bath 111 while the liquid treating chemical 121out (shown by an arrow) in the main bath 111 is discharged from the bottom portion of the main bath 111.

In each method mentioned above, a liquid treating chemical 121 is supplied to a main bath 111 storing the subject of treatment 131 while the liquid treating chemical 121 is discharged to the outside of the main bath 111, wherein the adopted flow rate of the liquid treating chemical supplied ranges widely from a very small quantity to several dozens dm$^3$/min. Generally, the optimum flow rate is set depending on the geometric shape of the main bath 111 and an outer bath 112, the subject of treatment 131 and the type of the liquid treating chemical 121 supplied. The set flow rate does not always have only one value; recent multi-functionalization in apparatuses has made it possible that more than one liquid treating chemicals are supplied alternately. In such a case, each time the type of liquid treating chemical is changed, the flow rate should be changed. Furthermore, even though apparatuses are designed so that the flow rate of a liquid treating chemical supplied is always constant during the supply, there are some cases where the flow rate variation during each supplying operation or the variation over a long time period exceeds a negligible level.

Further, in order to treat (for example, clean, wet-etch, etc.) the subject of treatment 131 uniformly, it is required that the liquid treating chemical 121 is sufficiently in contact with the face surface (or the back surface) of the subject of treatment 131 and that the liquid treating chemical 121 flows as laminar state as possible.

In the above-described overflow type chemical treating apparatus 101, regardless of the amount or variation of supply from the bottom portion of the main bath 111, the flow rate of the liquid treating chemical 121 in the main bath 111 is determined by the height of the wall of the main bath 111. Thus, unless the liquid treating chemical 121 is discharged from the main bath 111, the flow rate is stable irrespective of the amount of supply. Most of the conventional cleaning baths are overflow type ones which have such a structure that the liquid treating chemical 121 is supplied from the bottom portion of the main bath 111 and discharged to the outer bath 112. Therefore, the discharging capacity should be equivalent or exceed to the expected amount of supply. In addition, various discharging methods are applicable; that is, either the method using gravitation or the method using a pump is available. Therefore, variation of supply can be managed naturally by allowing the opening of the discharging port to have some extra area, for example.

On the other hand, in the above-mentioned down-flow type chemical treating apparatus 102, in order to keep the amount of the liquid treating chemical in the main bath 111 constant independent of the variation in the amount of supply of the liquid treating chemical 121 from the outer bath 112, it is necessary to discharge the same amount of the liquid treating chemical 121 as the amount of supply.

OBJECT AND SUMMARY OF THE INVENTION

Object of the Invention

However, the conventional method which has been applicable to discharge a liquid treating chemical from the bottom portion of a main bath is either dropping the liquid treating chemical by gravity or discharging the liquid treating chemical with a pulsation pump. Therefore, the method for discharging a liquid treating chemical from the bottom portion of a main bath has been utilized only for the purpose of reducing the amount of the liquid treating chemical in the main bath or emptying the main bath. In such a conventional method, it is hard to allow the amount of discharge to be continuously variable and to control the amount of discharge according to the amount or variation of amount of the liquid treating chemical supplied from the outer bath. Specifically, since it is hard to discharge the liquid treating chemical from the main bath according to the amount of supply of the liquid treating chemical, the flow rate (the liquid level) of the main bath is not constant.

Figure 7A:
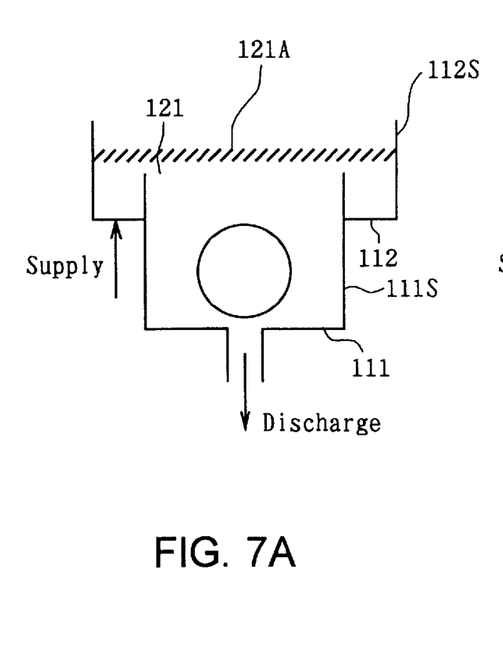
FIGS. 7A, 7B and 7C are diagrams illustrating one problem of a down-flow type chemical treating apparatus; and FIGS. BA and 8B are diagrams illustrating another problem of a down-flow type chemical treating apparatus.
Figure 7B:
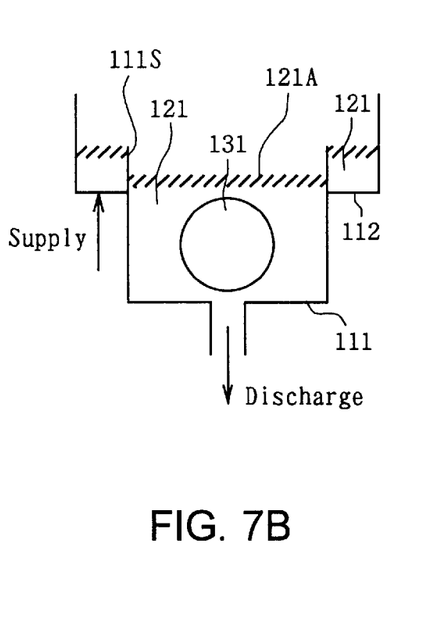

To be concrete, when the amount of the liquid treating chemical 121 supplied from the outer bath 112 is decreased from the liquid level 121A as shown in FIG. 7A, on which the liquid treating chemical 121 is held at a certain height higher than the side wall 111s of the main bath 111 and lower than the side wall 112s of the outer bath 112, to the level shown in FIG. 7B for example, the amount of discharge exceeds the amount of supply, and the amount of the liquid treating chemical 121 in the main bath 111 decreases. With the decrease, the liquid level 121A lowers, and when the level is lower than the upper end of the wall 111s of the main bath 111, the flow of the liquid treating chemical 121 around the subject of treatment 131 changes from the laminar state. In such a situation, the liquid treating chemical 121 dropping down the inner wall of the main bath 111 flows only in the neighborhood of the side wall 111s of the main bath 111. Furthermore, after the liquid level 121A reaches the subject of treatment 131, the upper portion of the subject of treatment 131 exposes from the liquid level 121A, which makes the treatment (for example, cleaning, etching, etc.) ineffective in such a portion.

Figure 7C:
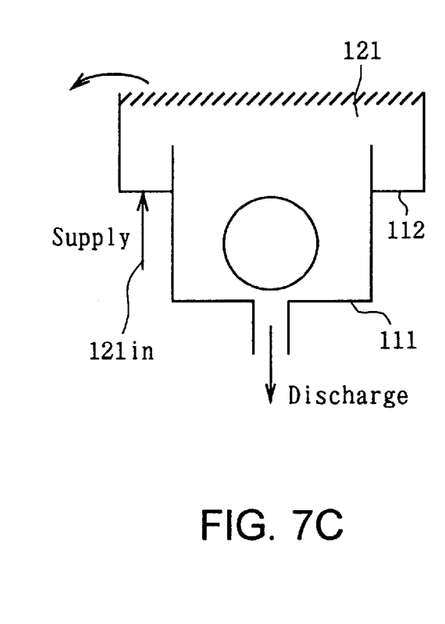

On the other hand, when the flow rate of a liquid treating chemical 121in (shown by an arrow) supplied increases, as shown in FIG. 7C, the amount of discharge does not catch up with the amount of supply. Consequently, the amount of the liquid treating chemical 121 left in the outer bath 112 and the main bath 111 increases, and soon the liquid treating chemical overflows the outer bath 112.

Figure 8A:
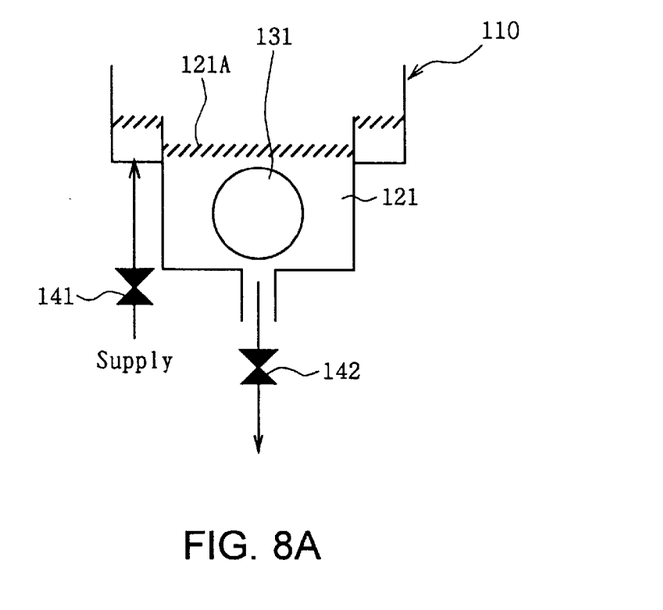
Figure 8B:
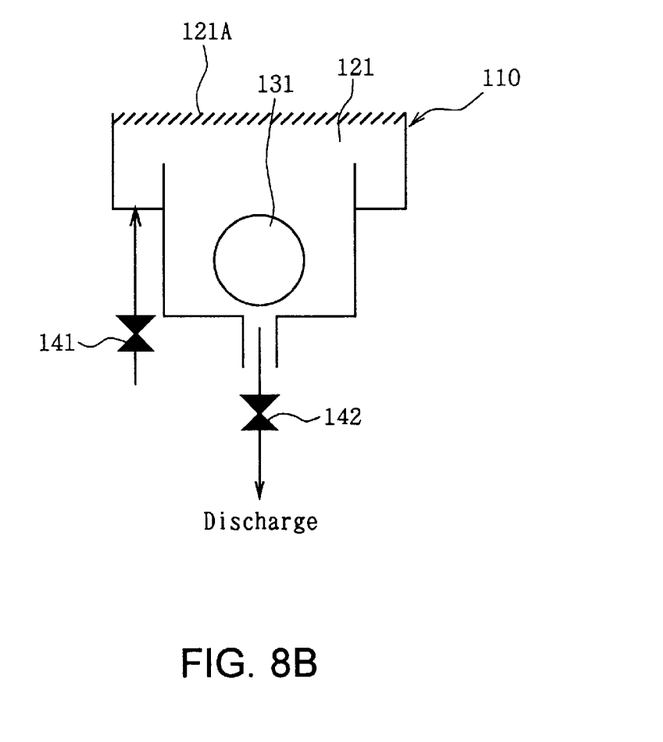

When attempting a solution of the above problem using the prior art, as shown in FIGS. 8A and 8B, the attempt must be followed by opening and closing a valve for supply 141, a valve for discharge 142 or a pump (not shown in FIGS.). As shown in FIG. 8A, when the liquid level 121A of the liquid treating chemical 121 lowers with the decreasing amount of supply, the valve for discharge 142 is in closing action while the valve for supply 141 is in opening action. On the other hand, as shown in FIG. 8B, when the liquid level 121A of the liquid treating chemical 121 rises with the increasing amount of supply for the treating bath 110, the valve for supply 141 is in closing action while the valve for discharge 142 is in opening action. Although this method can keep the height of the liquid level 121A constant, in each case where the valve for supply or for discharge is in closing action, the action causes the flow of the liquid treating chemical 121 around the subject of treatment 131 to vary from the laminar state. In addition, it can cause the flow of the liquid treating chemical 121 to stop depending on the situation. This results in loss of efficiency in treating the subject of treatment.

Thus, the amount of the liquid treating chemical in the bath must be held constant by discharging almost the same amount of the liquid treating chemical as that of the liquid treating chemical supplied. In addition, abrupt changes in the amount of discharge caused by, for example, opening and closing the discharge port must be avoided.

Summary of the Invention

The present invention provides a chemical treating apparatus and a flow rate controlling method thereof which are invented to overcome the above-mentioned problems.

Specifically, the chemical treating apparatus of the present invention is a down-flow type chemical treating apparatus in which a liquid treating chemical is supplied from the outside of a treating bath and discharged from the bottom portion of the treating bath, comprising a pump on the chemical discharging side of the treating bath which allows to discharge the liquid treating chemical to the outside of the treating bath substantially keeping the flow of the liquid treating chemical in the treating bath in the laminar state.

In the aforesaid chemical treating apparatus, a pump is provided on the chemical discharging side of the treating bath which allows to discharge the liquid treating chemical in the treating bath to the outside of the treating bath substantially keeping the flow of the liquid treating chemical in the laminar state: therefore, even when the liquid treating chemical in the treating bath is discharged by the pump, the flow of the liquid treating chemical in the treating bath is kept in the laminar state.

As a result, the liquid treating chemical is prevented from lowering to such a degree that the subject of treatment exposes from the liquid treating chemical, or rising to such a degree that the liquid treating chemical overflows the treating bath, which enables uniform and efficient treatment over the subject of treatment.

The flow rate controlling method of the chemical treating apparatus is a flow rate controlling method for a down-flow type chemical treating apparatus in which a liquid treating chemical is supplied from the outside of a treating bath and discharged from the bottom portion of the treating bath, comprising processes of detecting the amount of the liquid treating chemical supplied to the treating bath, and discharging almost the same amount of the liquid treating chemical as that of the liquid treating chemical detected.

In the aforesaid flow rate controlling method of the chemical treating apparatus, the process of detecting the amount of the liquid treating chemical supplied to the treating bath shows the amount of the liquid treating chemical supplied to the treating bath. The process of discharging almost the same amount of the liquid treating chemical as that of the liquid treating chemical detected allows the liquid treating chemical in the treating bath to be always constant in quantity, which makes it possible to prevent the liquid treating chemical from lowering to such a degree that the subject of treatment exposes from the liquid level or rising to such a degree that the liquid treating chemical overflows the treating bath.

The nature, principle and utility of the invention will become more apparent from the following detailed description when read in conjunction with the accompanying drawings in which like parts are designated by like reference numerals or characters.

DETAILED DESCRIPTION OF THE EMBODIMENTS

Preferred embodiments of this invention will be described with reference to the accompanying drawings:

One example in an embodiment of the chemical treating apparatus of the present invention will be described with reference to the schematic block diagram of FIG. 3.

Figure 3:
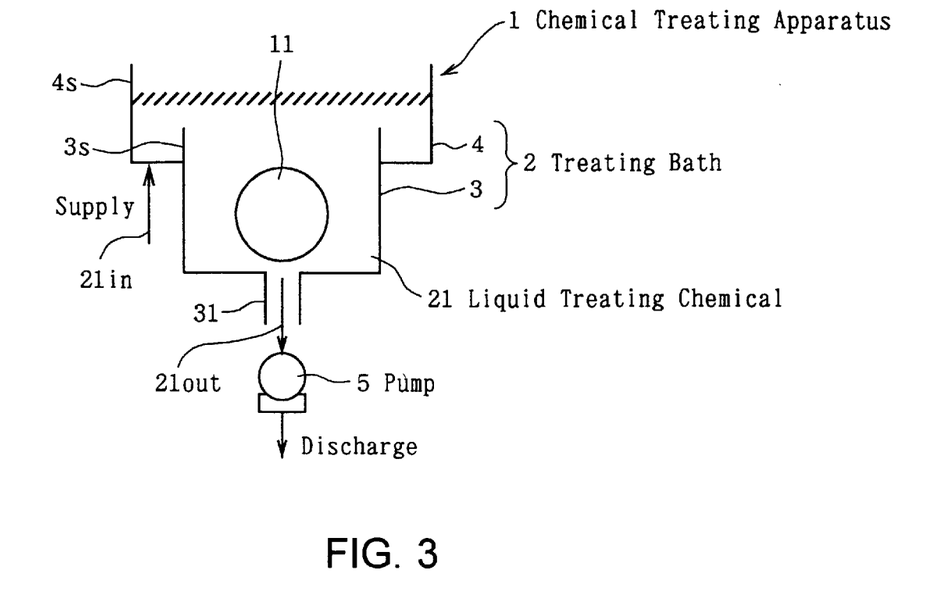
FIG. 3 is a schematic block diagram illustrating an embodiment of the chemical treating apparatus according to the present invention.

As shown in FIG. 3, a chemical treating apparatus 1 is a down-flow type chemical treating apparatus in which a liquid treating chemical (liquid chemical) 21in (shown by an arrow) is supplied from the outside of a treating bath 2 while the liquid treating chemical 21out is discharged from the bottom portion of the treating bath 2. This chemical treating apparatus 1 can be, for example, either a cleaning apparatus or a wet etching apparatus depending on the type of liquid treating chemical 21. The above-mentioned treating bath 2 consists of a main bath 3 storing the subject of treatment (for example, a semiconductor wafer, a glass wafer, etc.) 11 subjected to liquid chemical treatment and an outer bath 4 being the supplying-side of the liquid treating chemical 21 formed on the top periphery of the main bath 3. The side wall 4s of the outer bath 4 is formed so as to be higher than the side wall 3s of the main bath 3.

In the main bath 3 provided is a discharging portion 31 for the liquid treating chemical 21, and in the discharging portion 31 provided is a pump 5 which allows to discharge the liquid treating chemical 21 in the main bath 3 to the outside of the main bath 3 keeping the flow of the liquid treating chemical 21 substantially in the laminar state. For the pump 5 used are, for example, rotary pumps (centrifugal pumps such as a volute pump and a turbine pump, an axial-flow pump, a vane pump, and the like). These rotary pumps are characterized by electrically continuous controllability and prompt variability of the number of revolutions (torque). Making use of these characteristics, that is, by making a pump promptly respond to the changes in supply and then changing the amount of discharge of the liquid treating chemical 21 from the main bath 3, the disorder of the flow of the liquid treating chemical 21 around the subject of treatment 11 is minimized and the laminar flow is maintained.

As described above, at the discharging portion 31 formed on the discharging side of the main bath 3 of the treating bath 2, the chemical treating apparatus 1 comprises a pump 5 consisting of a rotary pump which can discharge the liquid treating chemical 21 in the treating bath 2, especially in the main bath 3, to the outside of the main bath 3 keeping the flow of the liquid treating chemical 21 in the laminar state. Therefore, when the liquid treating chemical 21 in the main bath 3 is discharged by the above-described pump 5, the liquid treating chemical treating 21 can be discharged to the outside of the main bath 3 without any abrupt changes in flow rate, so that the flow of the liquid treating chemical 21 in the main bath 3 is kept in the laminar state.

Now, a configuration of the control device of the pump 5 will be described with reference to the schematic diagram of FIG. 4.

Figure 4:
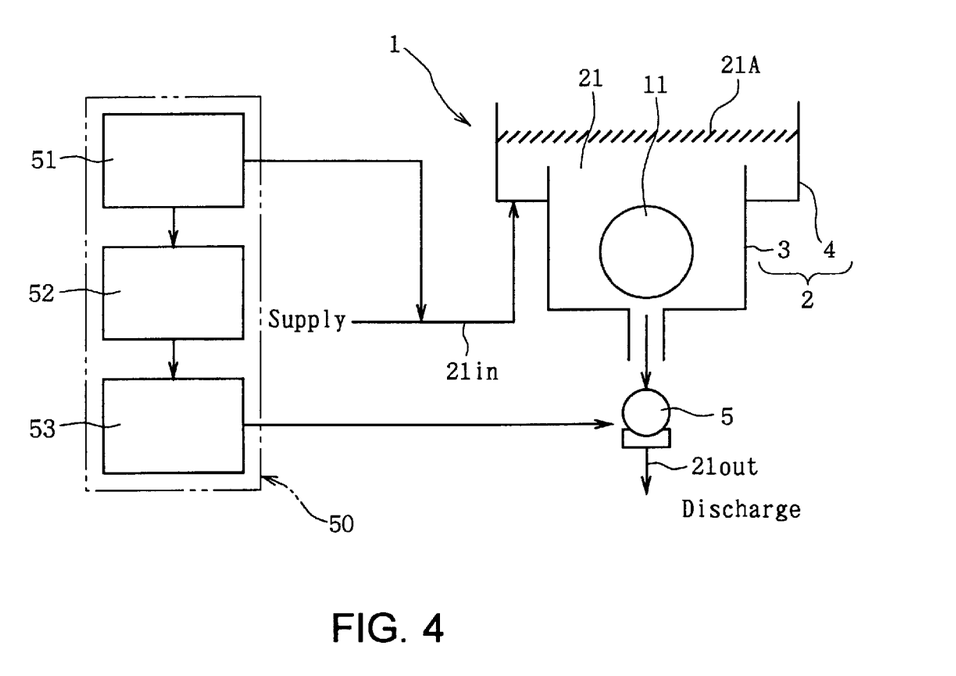
FIG. 4 is a schematic block diagram illustrating an embodiment of the pump controller of the chemical treating apparatus.

As shown in FIG. 4, a flow detecting portion 51 which detects the flow rate of a liquid treating chemical 21in (shown by an arrow) supplied to an outer bath 4 of the treating bath 2 is provided in the supplying passageway of the liquid treating chemical 21 to the treating bath 2 of the chemical treating apparatus 1 described above with reference to FIG. 3. This flow detecting portion 51 consists of, for example, a detection device such as an ultrasonic flowmeter, which constantly detects the flow rate and outputs its value. To the flow detecting portion 51, connected is an operating portion 52 (for example, a program controller, etc.) which calculates the amount of discharge of the liquid treating chemical 21 equivalent to the detected flow rate of the liquid treating chemical 21in. Furthermore, to the operating portion 52, connected is a pump controlling portion 53 (for example, a rotation controlling inverter, etc.) which gives instructions to drive the pump 5 provided on the discharging side of the main bath 3.

Next, one example of controlling methods for pump 5 which utilizes a control device 50 consisting of the flow detecting portion 51, operating portion 52 and pump controlling portion 53 will be described. This controlling method is to control the number of revolutions of the pump 5 according to the flow rate of the liquid treating chemical 21 supplied. First, the operation for detecting the amount of the liquid treating chemical 21 supplied to the treating bath 2 is performed by a flow rate detecting portion 11. Specifically, the flow rate of the liquid treating chemical 21in, which flows through the passageway of the liquid treating chemical 21 supplied to the treating bath 2, is constantly detected and its value is output. Then, performed is the operation for discharging from the treating bath 2 the same amount of the liquid treating chemical 21 as that of the liquid treating chemical detected. Specifically, the output flow rate value described above is input to an operating portion 52, and in this operating portion 52 the number of revolutions of the rotary pump is calculated so that the amount of supply equals to that of discharge, and the value is output. The results are output to a pump controlling portion 53 as an electrical signal (voltage level for analog, binary data for digital), and a pump 5 is driven while its number of revolutions is subjected to control according to the output results. Constant detection of the flow rate of the liquid treating chemical 21in supplied and prompt operation of the detected results make possible a constant control of the number of revolutions of the pump 5. Since the controlled variable (the amount of discharge) is varied according to the control input (the amount of supply), it can be said that the controlling method is of feedforward control. This controlling method is excellent in the promptitude with which it deals with the changes in the amount of supply.

The controlling method of the above-described chemical treating apparatus 1 detects the amount of the liquid treating chemical 21in supplied to the treating bath 2 and discharges almost the same amount of the liquid treating chemical 21 (21out) as that of the detected liquid treating chemical 21in from the treating bath 2 with a pump 5; consequently, there is always a certain amount of liquid treating chemical 21 in the treating bath 2. In other words, the liquid level 21A of the liquid treating chemical 21 in the treating bath 2 is kept constant. Thus, the liquid treating chemical 21 does not lower to such a degree that the subject of treatment 11 exposes from the liquid treating chemical 21, or does not rise to such a degree that the liquid treating chemical 21 overflows the treating bath 2.

Next, another configuration of the control device of the pump 5 will be described with reference to the schematic block diagram of FIG. 5.

Figure 5:
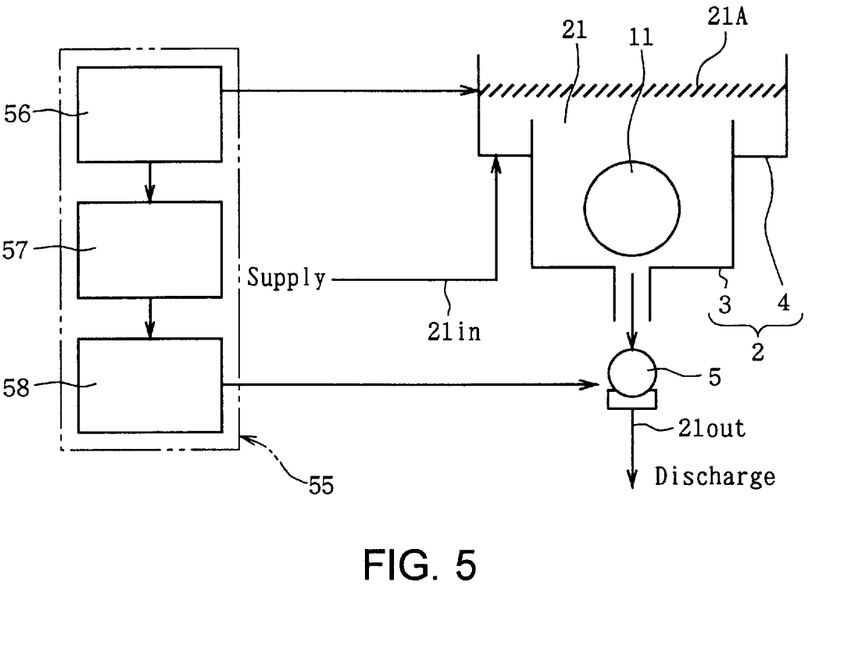
FIG. 5 is a schematic block diagram illustrating another embodiment of the pump controller of the chemical treating apparatus.

As shown in FIG. 5, in the treating bath 2 of the chemical treating apparatus 1 described above with reference to FIG. 3, a liquid level detecting portion 56 for detecting the liquid level of the liquid treating chemical 21 stored in the treating bath 2 is provided. This liquid level detecting portion 56 consists of something which constantly detects the liquid level and outputs its value, for example, a liquid level detecting sensor using a float. To the liquid level detecting portion 56, connected is an operating portion 57 which calculates the amount of discharge of the liquid treating chemical 21 so that the liquid level of the liquid treating chemical 21 is always constant. Furthermore, to the operating portion 57, connected is a pump controlling portion 58 (for example, a rotation controlling inverter, etc.) which gives instructions to drive a pump 5 provided on the discharging side of the main bath 3 so that the amount of discharge equals to the calculated value.

Then, one example of controlling methods for pump 5 which utilizes a control device 55 consisting of the above-mentioned liquid level detecting portion 56, operating portion 57 and pump controlling portion 58 will be described. This controlling method is to control the number of revolutions of pump 5 so that the liquid level of the liquid treating chemical 21 is kept constant. First, the liquid level 21A of the liquid treating chemical 21 in the treating bath 2 is detected constantly by the liquid level detecting portion 56, and the detected value is output. At this time, the liquid treating chemical 21in (shown by an arrow) is continuously supplied to the outer bath 4. The liquid level output from the liquid level detecting portion 56 is input to the operating portion 57, and the liquid level detected is compared with a previously set value. If the liquid level detected is higher than the previously set value, the controlled variable (the amount of discharge of the liquid treating chemical 21out) of the pump 5 is increased; and contrarily, if the liquid level detected is lower than the previously set value, the controlled variable (the amount of discharge of the liquid treating chemical 21out) of the pump 5 is decreased. The amounts of increase/decrease can be uniform, and if the controlled variable is highly increased/decreased according to the deflection of the liquid level, the liquid level is allowed to converge at the set value more quickly.

The output from the above-described operating portion 57 is output to the pump controlling portion 58 as an electrical signal (voltage level for analog, binary data for digital) for example, and the pump 5 is driven while its number of revolutions is subjected to control according to the controlled variable. Constant detection of the liquid level of the liquid treating chemical and prompt operation of the detection result make possible constant control of the number of revolutions of the pump 5.

It can be said that such a controlling method is a feedback control in which controlled variable is changed according to the conditions of change (liquid level) resulting from predetermined control input (amount of supply) and controlled variable (amount of discharge). An advantage of this method is that a flow rate can be controlled (the liquid level can be retained) without failure.

Using the advantages of both the control device and controlling method described above with reference to FIG. 4 and the ones described with reference to FIG. 5, both the control devices and controlling methods can be used jointly for further stable flow rate control.

As described above, detecting the liquid level of the liquid treating chemical 21 supplied to the treating bath 2 and determining the controlled variable of the pump 5 based on the difference between the detected and predetermined liquid levels make it possible that the liquid level of the liquid treating chemical 21 is kept at a predetermined height. Thus, there is always a certain amount of liquid treating chemical 21 in the treating bath 2, which prevents the liquid treating chemical 21 from lowering to such a degree that the subject of treatment 11 exposed from the liquid treating chemical 21 or rising to such a degree that the liquid treating chemical 21 overflows the treating bath 2.

Figure 6:
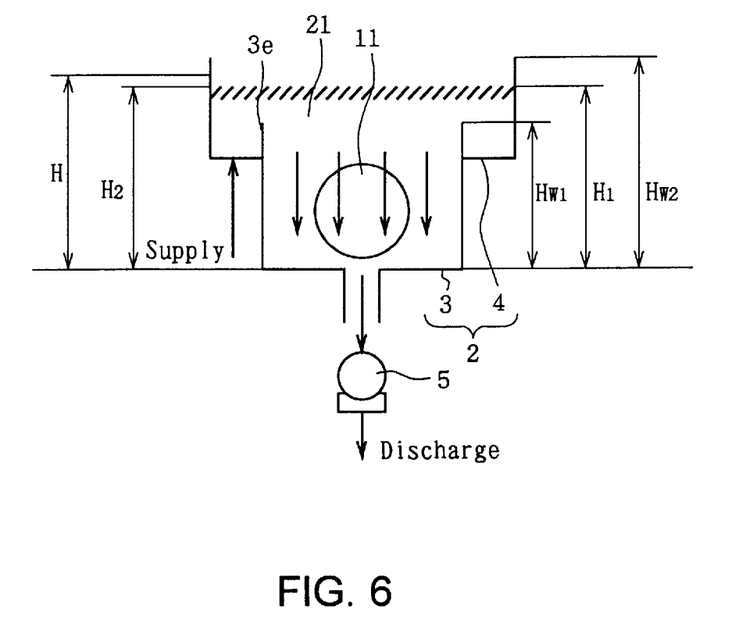
FIG. 6 is a diagram illustrating a flow rate controlling method which aims at stabilization of the flow in the proximity of the subject of treatment by ensuring the liquid level of a liquid treating chemical at a constant height.

Then, a flow rate controlling method for ensuring a certain height of the liquid level of the liquid treating chemical and stabilizing the flow of the liquid treating chemical around the subject of treatment will be described with reference to the schematic block diagram of FIG. 6. In FIG. 6, the same constitutive portions as in FIGS. 3–5 are designated by the same symbols used in FIGS. 3–5.

As shown in FIG. 6, this method uses a treating bath 2 consisting of a main bath 3 and an outer bath 4 which allows its liquid level to be higher than the upper edge 3e of the main bath 3 and is provided on the top periphery of the main bath 3. The liquid level $H_1$ of the liquid treating chemical 21 stored in the main bath 3 and the liquid level $H_2$ of the liquid treating chemical 21 stored in the outer bath 4 are detected. The amount of discharge of the liquid treating chemical 21 with a pump 5 is controlled so that the detected liquid level $H_1$ of the liquid treating chemical 21 in the main bath 3 and $H_2$ of the liquid treating chemical 21 in the outer bath 4 can be maintained at a predetermined level H (FIG. 6 shows one example). The predetermined level H is set so that it is higher than the height $Hw_1$ of the wall of the main bath 3 and lower than the height $Hw_2$ of the wall of the outer bath 4. Further, the amount of discharge of the liquid treating chemical 21 with a pump 5 is controlled so that, when the liquid treating chemical 21 is allowed to flow into the main bath 3 from the outer bath 4, the liquid level of the liquid treating chemical 21 in the outer bath 4 can be maintained at the predetermined height H higher than the height of the wall of the main bath 3.

As described above with reference to FIG. 6, the controlled variable of the pump 5 is controlled so that the change in the amount of discharge of the liquid treating chemical 21 is as much as the change in the amount of supply of the liquid treating chemical 21, and moreover, the discharge of the liquid treating chemical 21 is stable at the liquid level high enough for the subject of treatment 11; accordingly, the liquid treating chemical 21 flowing from the outer bath 4 into the main bath 3 does not stream down only on the wall of the main bath 3, but it flows into the main bath from the wide area over the wall of the main bath. As a result, the flow of the liquid treating chemical 21 in the proximity of the subject of treatment 11 is not subjected to abrupt changes, so that laminar flows in the main bath 3 can be realized.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A down-flow type chemical treating apparatus in which a liquid treating chemical is supplied from the outside of a treating bath while the liquid treating chemical is discharged from the bottom portion of said treating bath, said chemical treating apparatus comprising a rotary pump provided on the discharging side of said treating bath for discharging said liquid treating chemical to the outside of said treating bath keeping the flow of said liquid treating chemical in said treating bath in the laminar state.

2. The chemical treating apparatus according to claim 1, further comprising:

a flow rate detecting portion for detecting the flow rate of the liquid treating chemical supplied to said treating bath;

an operating portion for calculating the amount of discharge of the liquid treating chemical equaling to the flow rate of the liquid treating chemical detected by said flow detecting portion; and a pump controlling portion for driving said pump to discharge said calculated amount of the liquid treating chemical.

3. The chemical treating apparatus according to claim 1, further comprising:

a liquid level detecting portion for detecting the liquid level of the liquid treating chemical in said treating bath;

an operating portion for calculating the amount of the liquid treating chemical to be supplied to said treating bath and the amount of discharge of the liquid treating chemical to be discharged from said treating bath based on the liquid level of the liquid treating chemical detected by said liquid level detecting portion; and a pump controlling portion for driving said pump to discharge said calculated amount of the liquid treating chemical.

4. A down-flow type chemical treating apparatus in which a liquid treating chemical is supplied from outside of a treating bath while the liquid treating chemical is discharged from a bottom portion of said treating bath, said chemical treating apparatus comprising:

a pump provided on the discharging side of said treating bath for discharging said liquid treating chemical to the outside of said treating bath keeping the flow of said liquid treating chemical in said treating bath in the laminar state; and a flow rate detecting portion for detecting the flow rate of the liquid treating chemical supplied to said treating bath.

5. The chemical treating apparatus according to claim 4, further comprising:

an operating portion for calculating the amount of discharge of the liquid treating chemical equaling to the flow rate of the liquid treating chemical detected by said flow detecting portion.

6. The chemical treating apparatus according to claim 5, further comprising:

a pump controlling portion for driving said pump to discharge said calculated amount of the liquid treating chemical.

7. A down-flow type chemical treating apparatus in which a liquid treating chemical is supplied from outside of a treating bath while the liquid treating chemical is discharged from a bottom portion of said treating bath, said chemical treating apparatus comprising:

a pump provided on the discharging side of said treating bath for discharging said liquid treating chemical to the outside of said treating bath keeping the flow of said liquid treating chemical in said treating bath in the laminar state; and a liquid level detecting portion for detecting the liquid level of the liquid treating chemical in said treating bath.

8. The chemical treating apparatus according to claim 7, further comprising:

an operating portion for calculating the amount of the liquid treating chemical to be supplied to said treating bath and the amount of discharge of the liquid treating chemical to be discharged from said treating bath based on the liquid level of the liquid treating chemical detected by said liquid level detecting portion.

9. The chemical treating apparatus according to claim 8, further comprising:

a pump controlling portion for driving said pump to discharge said calculated amount of the liquid treating chemical.

* * * * *